United States Patent [19]

Kimura

[11] Patent Number: 5,189,638
[45] Date of Patent: Feb. 23, 1993

[54] PORTABLE SEMICONDUCTOR MEMORY DEVICE

[75] Inventor: Masatoshi Kimura, Itami, Japan

[73] Assignee: Mitsubishi Denki Kabushiki Kaisha, Tokyo, Japan

[21] Appl. No.: 912,117

[22] Filed: Jul. 9, 1992

Related U.S. Application Data

[63] Continuation of Ser. No. 559,074, Jul. 30, 1990, abandoned.

[30] Foreign Application Priority Data

Apr. 26, 1990 [JP] Japan .................. 2-108634
Apr. 26, 1990 [JP] Japan .................. 2-108635
May 24, 1990 [JP] Japan .................. 2-132466

[51] Int. Cl.$^5$ .............................................. G11C 7/00
[52] U.S. Cl. ........................................ 365/52; 365/63; 235/492; 361/56; 361/91; 252/679
[58] Field of Search .............. 235/492; 365/52, 63; 357/23.13; 361/56, 91

[56] References Cited

U.S. PATENT DOCUMENTS

| | | | |
|---|---|---|---|
| 4,633,283 | 12/1986 | Avery | 357/23.13 |
| 4,780,791 | 10/1988 | Morita et al. | 361/395 |
| 4,789,347 | 12/1988 | Banjo et al. | 439/140 |
| 4,819,046 | 4/1989 | Misu | 357/23.13 |
| 4,839,768 | 6/1989 | Daniele et al. | 361/56 |
| 4,926,034 | 5/1990 | Banjo et al. | 235/492 |
| 4,928,199 | 5/1990 | Diaz et al. | 361/91 |
| 4,937,639 | 6/1990 | Yao et al. | 357/23.13 |
| 4,962,320 | 10/1990 | Okada et al. | 357/23.13 |
| 4,990,984 | 2/1991 | Misu | 357/23.13 |
| 5,019,883 | 5/1991 | Mori et al. | 357/23.13 |
| 5,027,174 | 6/1991 | Mimoto | 357/23.13 |

FOREIGN PATENT DOCUMENTS

| | | |
|---|---|---|
| 2104057 | 8/1971 | Fed. Rep. of Germany . |
| 2540186 | 3/1977 | Fed. Rep. of Germany . |
| 3402845 | 8/1985 | Fed. Rep. of Germany . |
| 8533911 | 3/1986 | Fed. Rep. of Germany . |
| 3535923 | 4/1986 | Fed. Rep. of Germany . |
| 3607049 | 9/1986 | Fed. Rep. of Germany . |
| 3730554 | 12/1988 | Fed. Rep. of Germany . |
| 9013036 | 1/1991 | Fed. Rep. of Germany . |
| 3639367 | 6/1991 | Fed. Rep. of Germany . |
| 63-281894 | 11/1988 | Japan . |
| 63-281895 | 11/1988 | Japan . |

*Primary Examiner*—Joseph E. Clawson, Jr.
*Attorney, Agent, or Firm*—Leydig, Voit & Mayer

[57] ABSTRACT

A portable semiconductor memory device includes a memory device storing data, a casing for accommodating the memory device, a connector through which the semiconductor memory device is connected to an external circuit, the connector having a plurality of terminals including an earth terminal and input/output terminals through which data is input to and output from the memory device, a first earth line through which the earth terminal of the connector is connected to the memory device, and a connection device disposed in the vicinity of the earth terminal of the connector for electrically connecting the earth terminal to the casing.

12 Claims, 7 Drawing Sheets

PORTABLE SEMICONDUCTOR MEMORY DEVICE

This application is a continuation of application Ser. No. 07/559,074, filed Jul. 30, 1990, now abandoned.

BACKGROUND OF THE INVENTION

Field of the Invention

The present invention relates to a portable semiconductor memory device, and more particularly, to countermeasures taken against static electricity in the semiconductor memory device.

Description of the Related Art

FIGS. 11 and 12 are respectively cross-sectional and plan views of a conventional portable semiconductor memory device. A semiconductor memory device 1 incorporates a printed-circuit board 3 on which a plurality of semiconductor memories 2 are mounted. The printed-circuit board 3 is mounted in a frame 4. Metal panels 5 and 6 are respectively supported on opposite surfaces of the frame 4, and a connector 7 through which this semiconductor memory device 1 is electrically connected to terminal equipment (not shown) is provided at one end of the frame 4. An earth line 3a of the printed-circuit board 3 is electrically connected to the panel 6 via a coil spring 8, and the panels 5 and 6 are electrically connected by bringing a claw 5a formed at the side of the panel 5 into engagement with a claw 6a formed at the side of the panel 6, as shown in FIG. 13.

Once the portable semiconductor memory device 1 arranged in the manner described above has been manufactured, a static electricity application test is conducted on the device 1 while the device is connected to terminal equipment 9, as shown in FIG. 14, by means of an electrostatic simulator 10 a discharge capacitor 13 is charged through a charging resistor 12 by means of a power source 11 in the electrostatic simulator 10. Next, the electric charges stored in the discharge capacitor 13 are applied to the panel 5 or 6 of the semiconductor memory device 1 through a discharge resistor 15 by switching a switch 14 with an electrode 16 of the electrostatic simulator 10 in contact with the panel 5 or 6 of the semiconductor memory device 1, causing a discharge current 17 to flow through the memory device 1. A reference numeral 18 denotes an external impedance.

FIG. 15 schematically illustrates how the discharge current 17 flows in the semiconductor memory device 1. Once the static electricity is applied to the panel 6 through the electrode 16 of the electrostatic simulator 10, the discharge current 17 flows from the panel 6 to the earth line 3a of the printed-circuit board 3 via the coil spring 8.

Since the coil spring 8 electrically connects the panel 6 to the earth line 3a of the printed-circuit board 3, it is conventionally disposed in a portion of the semiconductor memory device 1 which is remote from the connector 7, i.e., in a portion which is not heavily packed with circuit components or wires, as shown in FIGS. 11 and 12 In consequence, although part 17a of the discharge current 17 flows back to the terminal equipment 9 through the earth line 3a of the printed-circuit board 3 and an earth terminal 7a of the connector 7, another part 17b of the discharge current 17 passes through the semiconductor memories 2, and flows back to the terminal equipment 9 through a group of input/output terminals 7b and a power source terminal 7c of the connector 7. A reference numeral 19 denotes an earth impedance of the semiconductor memory device 1. How the discharge current 17b flows in the semiconductor memory 2 is illustrated in FIG. 16.

Generally, an electrostatic discharge current has a large value. If the discharge resistance is 200 $\Omega$, the capacitance of the discharge capacitor is 200 pF, the voltage applied to the capacitor is 10 kV, and the external impedance is 0 $\Omega$, the discharge current has a peak value of 50 A, and the time constant of the discharge current is 40 nsec = 200 $\Omega \times$ 200 pF.

Thus, in the conventional semiconductor memory device 1, since the large discharge current 17b passes through the semiconductor memories 2, there is the risk that the semiconductor memories 3 deteriorate or are damaged.

Furthermore, since the coil spring 8 and the connector 7 are spaced apart from each other, the earth impedance 19 of the semiconductor memory device 1 increases to a value that cannot be neglected, generating a back electromotive force e. If the effective impedance of the earth impedance 19 is L, the back electromotive force e is expressed as follows:

$$e = -L \cdot di / dt$$

where di is an instantaneous current, and dt is the time during which the instantaneous current flows.

In consequence, a potential difference builds up between the earth line 3a of the semiconductor memory device 1 and other signal lines, generating risks that the data stored in the semiconductor memories 2 is damaged and that the semiconductor memories 2 deteriorate or are damaged.

SUMMARY OF THE INVENTION

The present invention is directed to eliminating the aforementioned problems of the prior portable semiconductor memory device, and an òbject thereof is to provide a portable semiconductor memory device which prevents damage to stored data and deterioration in and damage to the memory means such as semiconductor memories when an electrostatic discharge occurs.

In an aspect of the present invention, there is provided a portable semiconductor memory device which comprises memory means for storing data, a casing accommodating the memory means, a connector through which the device may be connected to an external circuit, the connector having a plurality of terminals including an earth terminal and input/output terminals through which data is input to and output from the memory means, a first earth line through which the earth terminal of the connector is connected to the memory means, and connection means disposed in the vicinity of the earth terminal of the connector electrically connecting the earth terminal to the casing.

In another aspect of the present invention, there is provided a portable semiconductor memory device which comprises memory means for storing data, a casing accommodating the memory means, a connector through which the device may be connected to an external circuit, the connector having a plurality of terminals including an earth terminal and input/output terminals through which data is input to and output from the memory means, a first earth line connecting the earth terminal of the connector to the memory means, a second earth line branching off from the first earth line in the vicinity of the earth terminal of the connector, and connection means through which the second earth line is electrically connected to the casing.

In one aspect of the present invention, an electrostatic discharge current flows from the casing to the earth terminal of the connector through the connection means and then to an external circuit while the peak value thereof limited by the connection means.

In another aspect of the present invention, an electrostatic discharge current flows from the casing to the earth terminal of the connector through the connection means and the second earth line, and further to an external circuit while the peak value thereof is limited by the connection means.

DESCRIPTION OF THE PREFERRED EMBODIMENTS

Embodiments of the present invention will now be described with reference to the accompanying drawings.

Figure 1:
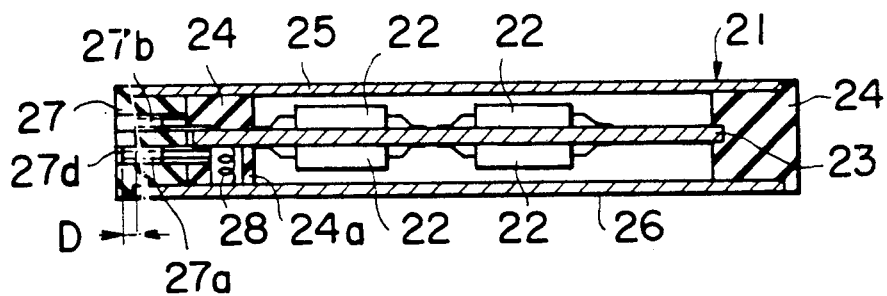
FIGS. 1 and 2 are respectively cross-sectional and plan views of a first embodiment of a portable semiconductor memory device according to the present invention.
Figure 2:
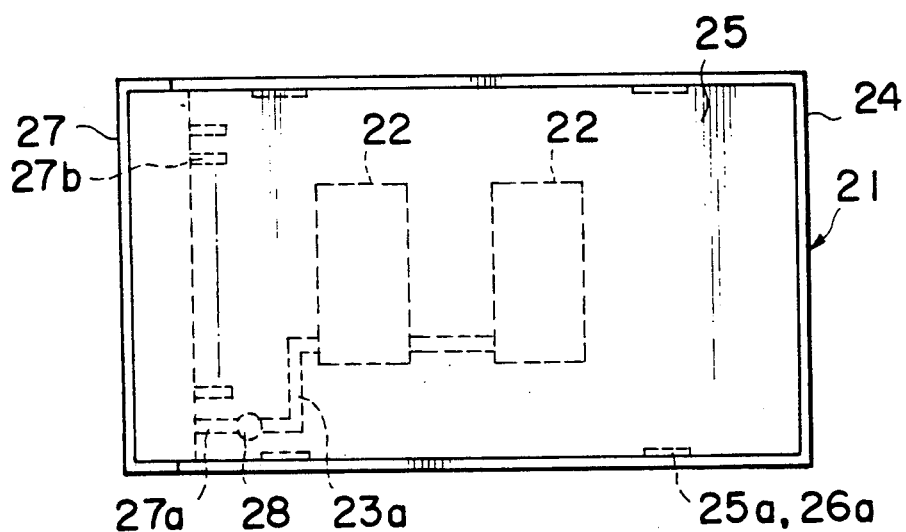

Referring first to FIGS. 1 and 2, a portable semiconductor memory device 21 according to a first embodiment of the present invention incorporates a printed-circuit board 23 on which a plurality of semiconductor memories 22 are mounted. The printed-circuit board 23 is mounted in a frame 24. Metal panels 25 and 26 are respectively supported on opposite surfaces of the frame 24, and a connector 27 through which this semiconductor memory device 21 is electrically connected to terminal equipment (not shown) is provided at one end portion of the frame 24.

The connector 27 has a plurality of terminals, including an earth terminal 27a, a plurality of input/output terminals 27b through which data is input to and output from the semiconductor memories 22, and a power source terminal (not shown). The earth terminal 27a is connected to an earth line 23a of the printed-circuit board 23, and the input/output terminals 27b are connected to the corresponding semiconductor memories 22 through wirings (not shown) of the printed-circuit board 23. The earth terminal 27a is made longer than the other terminals of the connector 27 such as the input/output terminals 27b by a distance of D and thus extends further toward an inserted port 27d of the connector 27.

A through-hole 24a is formed in the frame 24 in the vicinity of the earth terminal 27a of the connector 27 and at a position which faces the earth line of the printed-circuit board 23, and a coil spring 28 made of a conductor is placed in the through-hole 24 to electrically connect the earth line 23a of the printed-circuit board 23 and the panel 26.

The panels 25 and 26 respectively have a plurality of claws 25a and 26a on their sides, as shown in FIG. 2. The claws 25a are in engagement with the corresponding claws 26 a, whereby the panel 25 is electrically connected to the panel 26 so that there is no potential difference between the panels 25 and 26. That is, the panels 25 and 26 are electrically connected to the earth terminal 27a of the connector 27 through the coil spring 28 and the earth line 23a of the printed-circuit board 23.

The plurality of semiconductor memories 22 form a memory means, the panels 25 and 26 and the frame 24 in combination form a casing which houses the memory means, and the coil spring 28 comprises a connection means.

Figure 3:
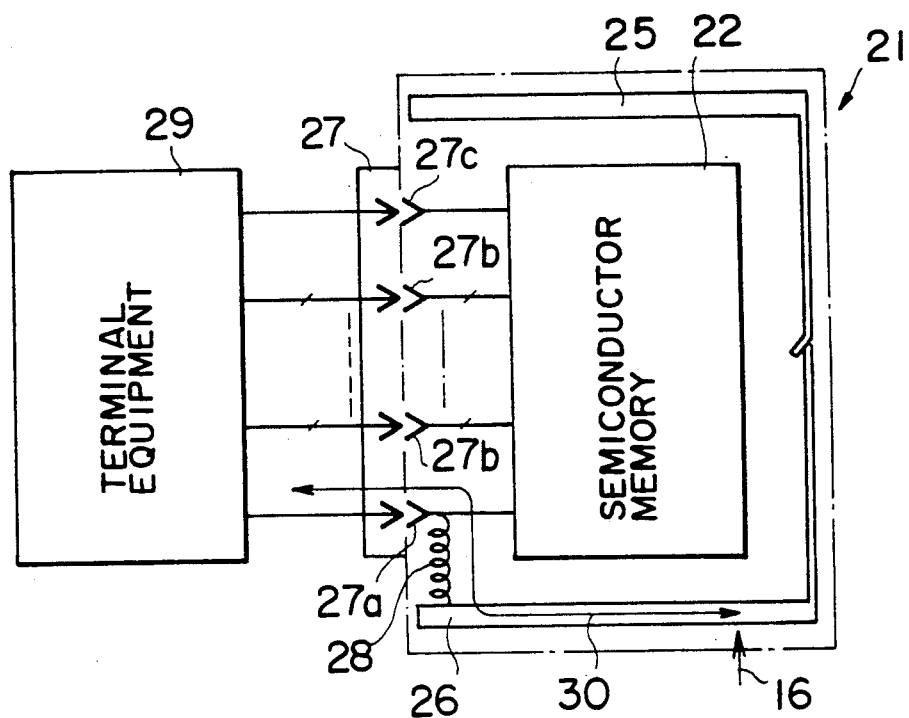
FIG. 3 schematically illustrates how a discharge current flows in the portable semiconductor memory device of FIGS. 1 and 2.
Figure 14:
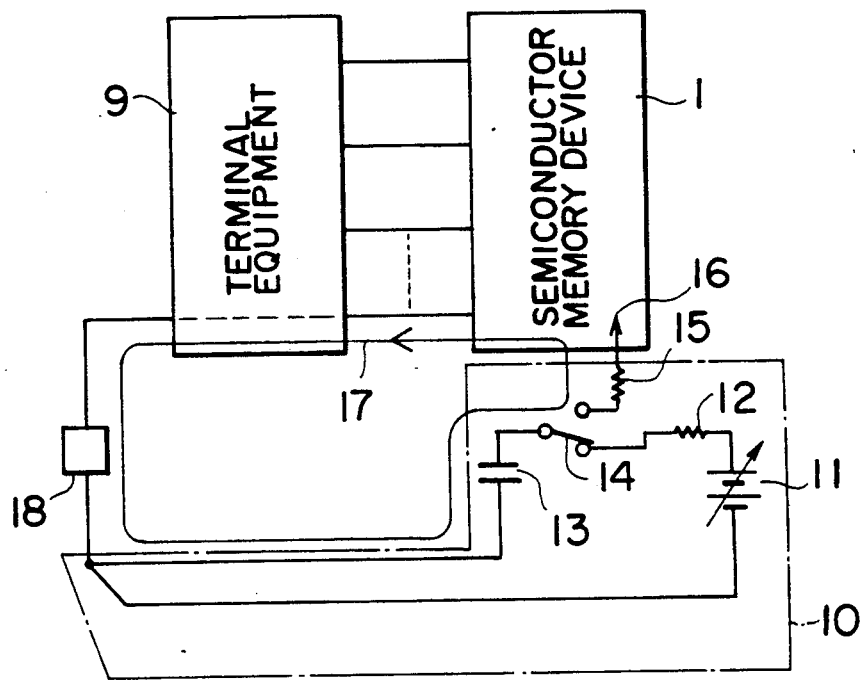
FIG. 14 shows how a static electricity application test is conducted on the portable semiconductor memory device.
Figure 15:
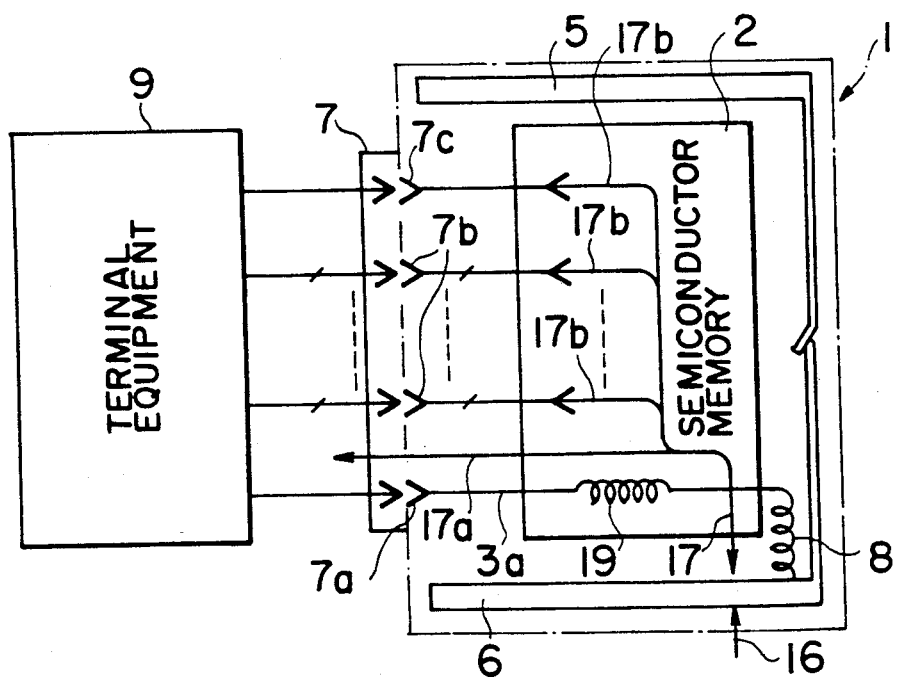
FIG. 15 schematically illustrates how a discharge current flows in the conventional portable semiconductor memory device.

Next, the operation of the first embodiment will be described. First, the connector 27 of the semiconductor memory device 21 is inserted into the terminal equipment 29, as shown in FIG. 3. In this state, the electrode 16 of the electrostatic simulator 10 shown in FIG. 14 is brought into contact with the panel 26 or 25 of the semiconductor memory device 21, and static electricity is then applied to the semiconductor memory device 21. This causes a discharge current 30 to flow from the panel 26 to the terminal equipment 29 through the coil spring 28, the earth line 23a of the printed-circuit board 23 and the earth terminal 27a of the connector 27. At that time, since the coil spring 28 is disposed in the vicinity of the earth terminal 27a of the connector 27, the discharge current 30 flows directly from the coil spring 28 to the earth terminal 27a of the connector 27 without flowing in the semiconductor memories 22 or to the input/output terminals 27b and the power source terminal 27c of the connector 27.

In consequence, the semiconductor memories 22 are prevented from deterioration or damage due to passage of the discharge current 30.

Furthermore, application of the static electricity raises the potential at the earth terminal 27a of the connector 27 from the reference potential of the discharge capacitor 13 of the electrostatic simulator 10, thereby raising the potential at the earth lines of the semiconductor memories 22. However, since a large number of components, such as decoupling capacitors, are generally fabricated between the earth line and the power source line in the semiconductor memory 22, the potential at the power source line or at the signal line of the semiconductor memory 22 rises in accordance with that at the earth line. In other words, no potential difference builds up between the earth line and the power source line or the signal line, and damage to stored data and deterioration in and damage to the semiconductor memory 22 is thereby eliminated.

When the discharge current 30 flows, the potentials at the panels 25 and 26, coil spring 28 and earth terminal 27a of the connector 27 instantaneously change. It is therefore desirable that these components be separated from adjacent circuits and signal lines by a distance which ensures that no creeping discharge occurs. Although the discharge current 30 also raises the potential of the electrical circuits in the terminal equipment 29, deterioration in and damage to the electrical circuits spaced can be eliminated by disposing these electrical circuits apart from other components by a creep distance which ensures that the effects of the rise of the potential caused by the discharge current are eliminated.

As shown in FIG. 1, the earth terminal 27a of the connector 27 is made longer than the other terminals and thus extends further toward the insertion port 27d of the connector 27. As a result, when the semiconductor memory device 21 is inserted into the terminal equipment 29, the earth terminal 27a is connected to the terminal equipment 29 prior to other terminals. This makes the countermeasures taken against the static electricity of the semiconductor memory device 22 more effective.

The direction of flow of the discharge current 30 is not limited to that described above. The discharge current 30 flows in an opposite direction, i.e., from the terminal equipment 29 to the panel 26 through the earth terminal 27a of the connector 27 and the coil spring 28, by reversing the polarities of the power source 11 of the electrostatic simulator 10.

The above-described first embodiment employs the coil spring 28 as the connection means. However, a ring-shaped spring 38 shown in FIG. 4A or a leaf spring 48 shown in FIG. 4B may also be employed.

Figure 5:
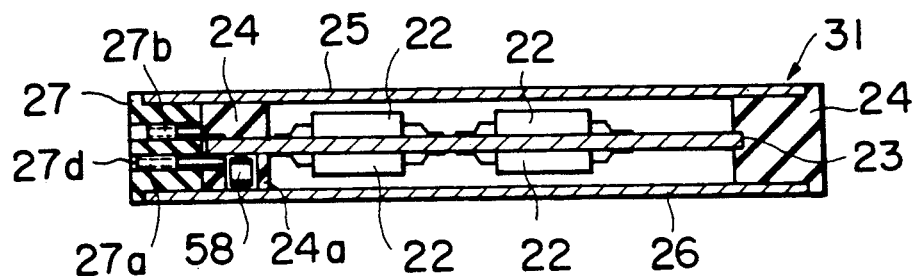
FIG. 5 is a cross-sectional view showing a second embodiment of the present invention.
Figure 6:
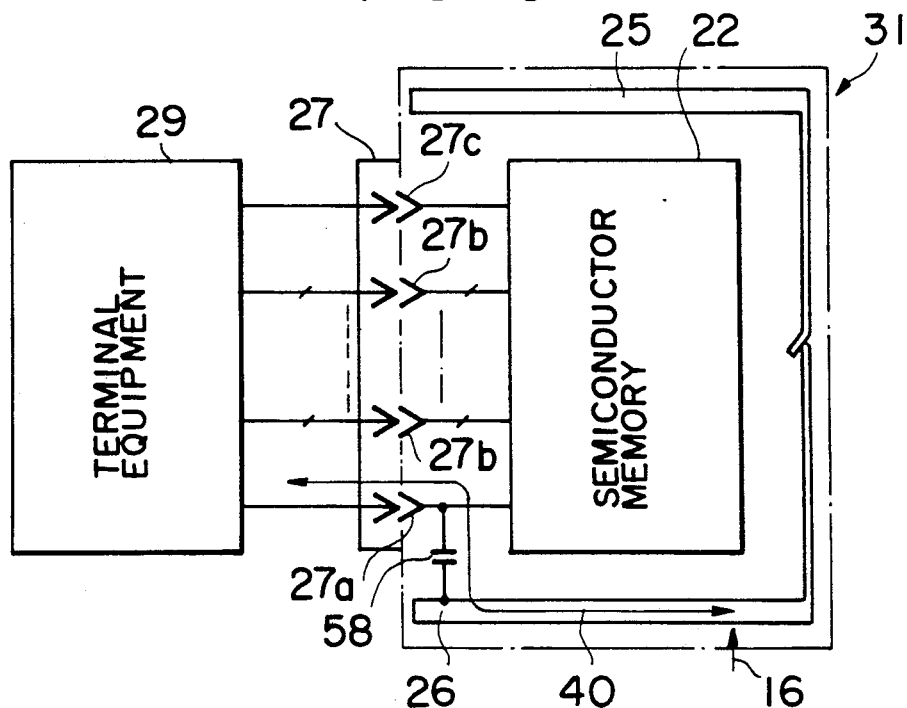
FIG. 6 schematically illustrates how a discharge current flows in the portable semiconductor memory device of FIG. 5.

FIG. 5 shows a second embodiment of the present invention. In this embodiment, a semiconductor memory device 31 employs a connection capacitor 58 as the connection means. The connection capacitor 58 is placed in the through-hole 24a formed in the frame 24. In this embodiment, when static electricity is applied to the panel 26, a discharge current 40 flows from the panel 26 to the interior of the semiconductor memory device 31, as shown in FIG. 6. However, the panel 26 is connected to the earth terminal 27a of the connector 27 through the connection capacitor 58 so that the flow of the direct current components of the discharge current 40 is blocked by the connection capacitor 58, i.e., only the alternating current components of the discharge current 40 pass through the connection capacitor 58, and then flow to the terminal equipment 29 through the earth terminal 27a of the connector 27.

In this second embodiment, since the connection capacitor 58 is disposed in the vicinity of the earth terminal 27a of the connector 27, no discharge current 40 flows in the semiconductor memories 22 or to the input-/output terminals 27b and the power source terminal 27c of the connector 27, thereby eliminating the risk of deterioration in and damage to the semiconductor memories 22, as in the case of the first embodiment.

Furthermore, since flow of the direct current components of the discharge current 40 is blocked by the connection capacitor 58, the value of the discharge current 40 which passes through the earth terminal 27a of the connector 27 is reduced. Furthermore, even if direct current noise is superimposed over the panels 25 and 26, they can be blocked by the connection capacitor 58, and adverse effects of the noise on the built-in semiconductor memories 22 are thereby eliminated. When the static electricity application test is to be conducted using the electrostatic simulator shown in FIG. 14, since the connection capacitor 58 is connected in series with the discharge capacitor 13 in the electrostatic simulator 10, the discharge time constant can be reduced to a value defined by the combined capacitance of these capacitors, thereby enabling the discharge energy to be reduced in an equivalent fashion.

Figure 7A:
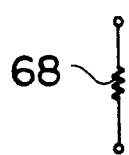
FIGS. 7A to 7D respectively show modifications of the connection means of the second embodiment of the present invention.

FIG. 7A shows a connection resistor 68 that can be employed as the connection means in place of the connection capacitor 58. With this connection resistor 68, the peak value of the discharge current 40 can be reduced to a low value determined by the resistance of the connection resistor 68. Furthermore, by connecting the connection resistor 68, the discharge time constant can be made larger and the potential at the input/output terminals of semiconductor devices incorporated in the electronic circuit in the terminal equipment 29 can rise when the potential at the earth terminal 27a of the connector 27 rises due to the discharge current 40. Consequently, generation of potential differences between the input/output terminals and the earth terminals in the semiconductor devices are prevented and, hence, damage to the semiconductor devices is eliminated.

Figure 7B:
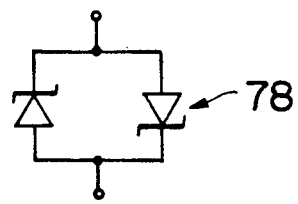

An overvoltage protecting element 78 shown in FIG. 7B may also be used as the connection means. This overvoltage protecting element 78 has an extremely high impedance until the terminal voltage thereof reaches an operation voltage (breakdown voltage), thereby blocking the flow of the direct and alternating current components of the discharge current 40. The impedance of the overvoltage protecting element 78 drops when the terminal voltage exceeds the operation voltage, by means of which the flow of the discharge current 40 to the earth terminal 27a is permitted. Practically, a bidirectional Zener diode, a surge absorber or a spark gap may be employed as the overvoltage protecting element 78.

Figure 7C:
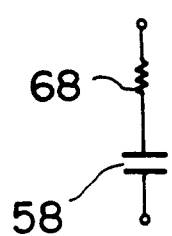
Figure 7D:
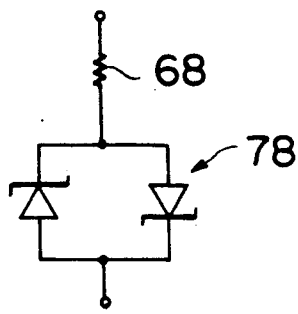

A combination of the connection capacitor 58 and the connection resistor 68 connected in series with each other, as shown in FIG. 7C, may also be employed as the connection means. With this combination, the flow of the direct current components can be blocked while the peak value of the discharge current can be limited. A combination of the connection resistor 68 and the overvoltage protecting element 78 connected in series with each other, as shown in FIG. 7D, may also be used as the connection means. With this combination, the peak value of the discharge current 40 can be limited by means of the connection resistor 68 after the impedance of the overvoltage protecting element 78 has been reduced by the operation of the overvoltage protecting element 78.

In the embodiment shown in FIG. 5, the connection capacitor 58 is packaged between the printed-circuit board 23 and the panel 26 connecting these components. However, the connection capacitor 58, the connection resistor 68 or the overvoltage protecting element 78 may be mounted on the printed-circuit board 23, with one terminal thereof connected to the earth terminal 27a of the connector 27 and the other terminal electrically connected to either the panel 25 or 26.

A third embodiment of the present invention will be described below with reference to FIGS. 8, 9 and 10. As shown in FIG. 9, in a semiconductor memory device 41, the earth terminal 27a of the connector 27 is connected to a first earth line 43a of the printed-circuit board 43, which is in turn connected to the semiconductor memories 22. On the printed-circuit board 43, a second earth line 43b, which is connected to the first earth line 43a in the vicinity of the earth terminal 27a of the connector 27, is also formed as a branch of the first earth line 43a.

Figure 8:
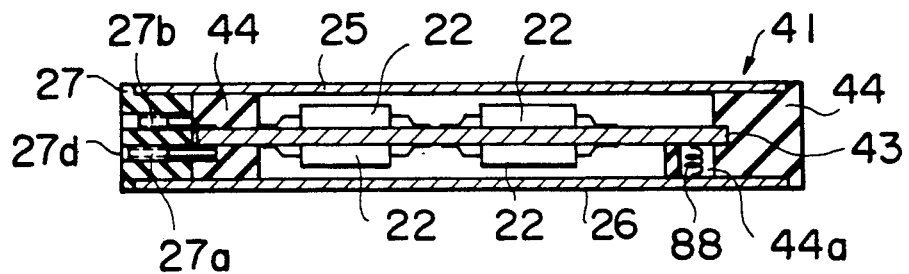
FIGS. 8 and 9 are respectively cross-sectional and plan views of a third embodiment of the present invention.
Figure 9:
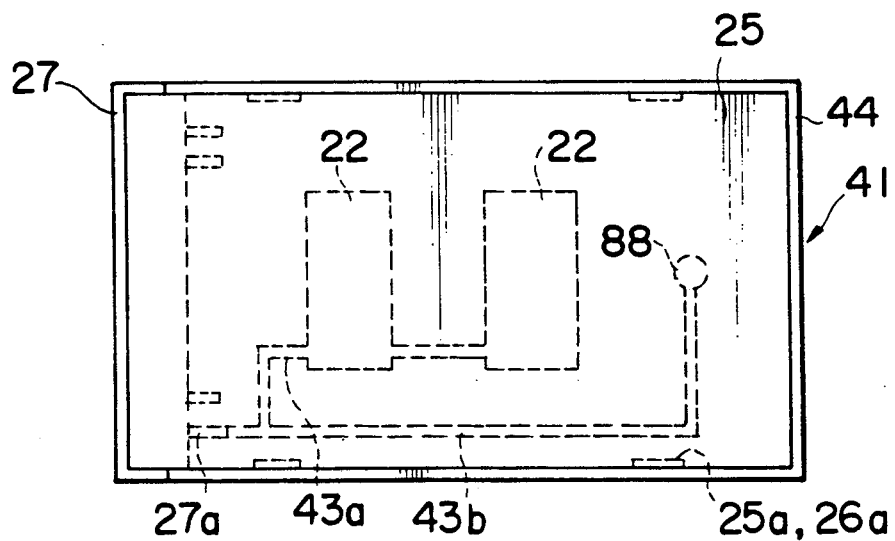

A through-hole 44a is formed in a portion of the frame 44 which is remote from the connector 27, i.e., in a portion which is not heavily packed with the devices such as the semiconductor memories 22 or wires, as shown in FIG. 8, and a coil spring 88 made of a conductor is placed in the through-hole 44a. The through-hole 44a is formed at a position where it aligns with the second earth line 43b so the coil spring 88 in the through-hole 44a electrically connects the second earth line 43b and the panel 26.

Figure 10:
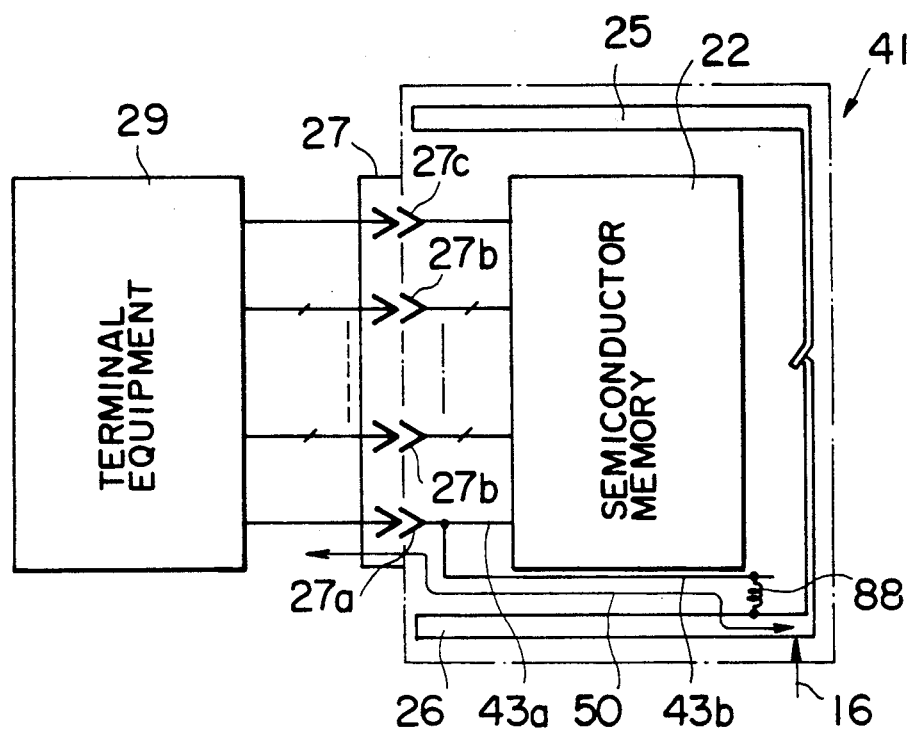
FIG. 10 schematically illustrates how a discharge current flows in the portable semiconductor memory device of FIGS. 8 and 9.
Figure 11:
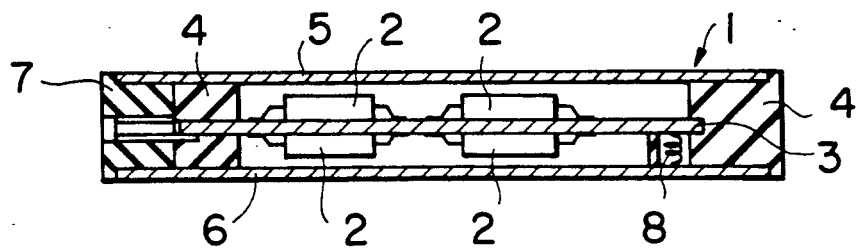
FIGS. 11 and 12 are respectively cross-sectional and plan views of a conventional portable semiconductor memory device.
Figure 12:
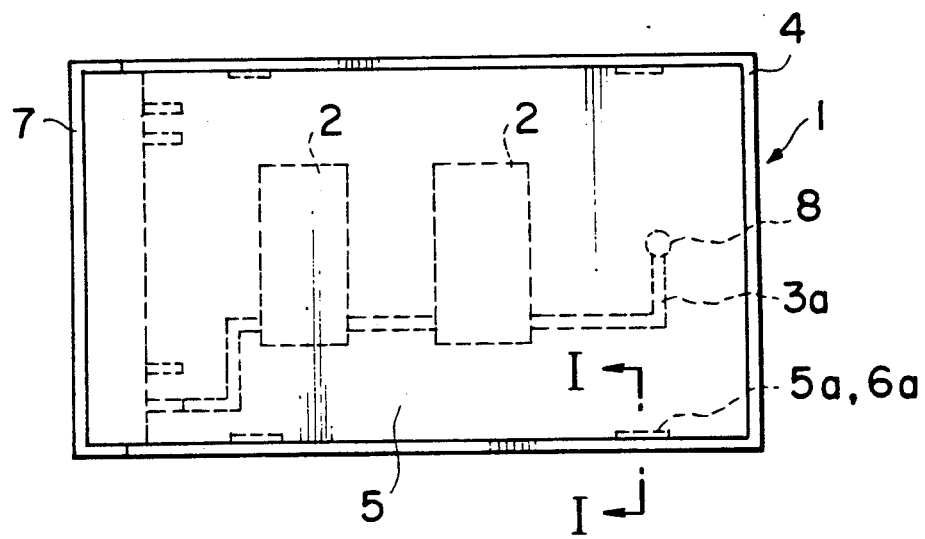
Figure 13:
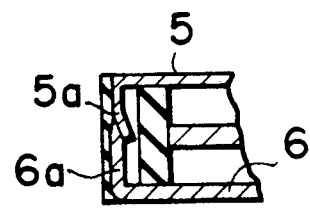
FIG. 13 is a sectional view taken along the line I—I of FIG. 12.
Figure 16:
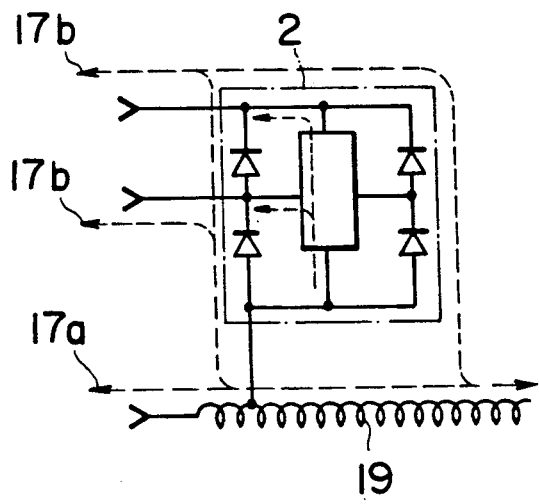
FIG. 16 illustrates how a discharge current flows in a semiconductor memory.

In this third embodiment, when static electricity is applied to the panel 26, as shown in FIG. 10, a discharge current 50 flows from the panel 26 to the terminal equipment 29 through the coil spring 88, the second earth line 43b and the earth terminal 27a of the connector 27. At that time, since the second earth line 43b of the printed-circuit board 43 branches off from the first earth line 43a in the vicinity of the earth terminal 27a of the connector 27, the discharge current 50 flows from the second earth line 43b to the earth terminal 27a of the connector 27 without flowing in the semiconductor memories 22 or to the input/output terminals 27b and the power source terminal 27c of the connector 27. Consequently, deterioration in and damage to the semiconductor memories 22, caused by passage of the discharge current 50, are eliminated.

Figure 4A:
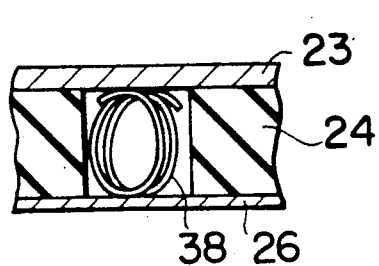
FIGS. 4A and 4B respectively show modifications of a connection means of the first embodiment of the present invention.
Figure 4B:
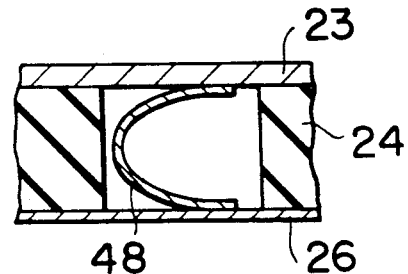

The third embodiment may employ in place of the coil spring 88 the ring-shaped spring 38 shown in FIG. 4A and the leaf spring 48 shown in FIG. 4b, or any of the elements shown in FIGS. 7A to 7D.

Furthermore, a multi-layer printed-circuit board may also be used as the printed-circuit board 43. In that case, the entirety or part of one layer is used as the second earth line 43b.

A storage medium other than the semiconductor memory 22 may also be used as the memory means in the above-described embodiments.

What is claimed is:

1. An IC card comprising:
memory means for storing data;
an enclosure housing said memory means, said housing including an electrically conductive casing comprising a pair of electrically conductive panels sandwiching said memory means and a frame supporting said panels and including a through hole;
a connector for connecting said device to an external circuit, said connector having a plurality of terminals including an earth terminal and input/output terminals through which data is input to and output from said memory means, the through hole in said frame being disposed adjacent said earth terminal;
a first earth line connecting said earth terminal to said memory means; and
connection means including at least one of a capacitor, a resistor, and an overvoltage protecting element disposed within the through hole in said frame electrically connecting said earth terminal to one of said panels.

2. The IC card according to claim 1 wherein said connection means is a capacitor and a resistor connected in series.

3. The IC card according to claim 1 wherein said earth terminal of said connector extends further away from said memory means than the other terminals of said connector.

4. The IC card according to claim 1 wherein said memory means comprises at least one semiconductor memory.

5. An IC card comprising:
memory means for storing data;
an enclosure housing said memory means, said housing including an electrically conductive casing comprising a pair of electrically panels sandwiching said memory means and a frame supporting said panels and including a through hole;
a connector for connecting said device to an external circuit, said connector having a plurality of terminals including an earth terminal and input/output terminals through which data is input to and output from said memory means;
a first earth line connecting said earth terminal to said memory means;
a second earth line connected to and branching off from said first earth line adjacent to said earth terminal of said connector; and
connection means including at least one of a capacitor, a resistor, and an overvoltage protecting element disposed within the through hole electrically connecting said second earth line to one of said panels.

6. The IC card according to claim 9 wherein said connection means is a capacitor and a resistor connected in series.

7. The IC card according to claim 5 wherein said earth terminal of said connector extends further away from said memory means than the other terminals of said connector.

8. The IC card according to claim 5 wherein said memory means comprises at least one semiconductor memory.

9. The IC card according to claim 1 wherein said connection means is an overvoltage protecting element comprising first and second zener diodes connected in parallel in opposite polarities.

10. The IC card according to claim 5 wherein said connection means is an overvoltage protecting element comprising first and second zener diodes connected in parallel in opposite polarities.

11. The IC card according to claim 1 wherein said connection means is an overvoltage protecting element and a resistor connected in series.

12. The IC card according to claim 5 wherein said connection means is an overvoltage protecting element and a resistor connected in series.

* * * * *